United States Patent
Chen et al.

(10) Patent No.: US 6,897,701 B2
(45) Date of Patent: May 24, 2005

(54) METHOD AND STRUCTURE FOR IMPROVING THE LINEARITY OF MOS SWITCHES

(75) Inventors: Feng Chen, Plano, TX (US); Donald C. Richardson, Plano, TX (US); Christopher L. Betty, Arlington, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/436,769

(22) Filed: May 13, 2003

(65) Prior Publication Data

US 2004/0227565 A1 Nov. 18, 2004

(51) Int. Cl.[7] .................................................. H03L 5/00
(52) U.S. Cl. ........................................ 327/307; 327/530
(58) Field of Search ............................... 327/307, 333, 327/382, 530, 534, 535, 540

(56) References Cited

U.S. PATENT DOCUMENTS

| | | | | |
|---|---|---|---|---|
| 5,689,209 A | * | 11/1997 | Williams et al. | 327/425 |
| 5,880,620 A | * | 3/1999 | Gitlin et al. | 327/534 |
| 6,064,262 A | * | 5/2000 | Wang | 330/253 |
| 6,628,159 B2 | * | 9/2003 | Voldman | 327/534 |
| 6,661,277 B2 | * | 12/2003 | Dabral | 327/534 |

* cited by examiner

Primary Examiner—Jeffrey Zweizig
(74) Attorney, Agent, or Firm—Frederick J. Telecky, Jr.; W. James Brady, III

(57) ABSTRACT

A technique is provided to linearize a MOS switch on-resistance and the nonlinear junction capacitance. The technique linearizes the sampling switch by using a buffer having substantially unity gain with proper DC shift to drive an isolated bulk terminal of the MOS well to improve the spurious free dynamic range (SFDR). In this way, the 2nd-order effect such as nonlinear body effect ($V_T(V_{SB})$) and nonlinear junction capacitance ($C_j(V_{SB})$) can be substantially removed.

11 Claims, 5 Drawing Sheets

METHOD AND STRUCTURE FOR IMPROVING THE LINEARITY OF MOS SWITCHES

BACKGROUND OF THE INVENTION

1. Field of the Invention

This invention relates generally to MOS switches, and more particularly, this invention relates to a technique to improve the linearity of a MOS switch beyond that achievable using known methods and structures.

2. Description of the Prior Art

MOS switches are commonly employed in both continuous time applications and sampling applications. Programmable gain amplifiers, for example, include MOS switches to select input and feedback resistors to achieve a desired gain. A typical sample and hold (S/H) circuit in a CMOS process employs two basic devices, a MOS switch and capacitor. The switch works in its triode region as a MOS resistor. Harmonic distortions (HDs) are generated when AC current charging the sampling capacitor Cs passes through the resistor whenever the capacitor and/or the resistor are nonlinear. As used herein, HD3 means third harmonic distortion.

A S/H circuit 10 can be modeled as shown in FIG. 1 with an NMOS switch 12 and Node B that is connected to $V_{SS}$. Sample and hold circuit 10 has a linear source resistance Rs 14, two nonlinear parasitic junction capacitances Cj 16, 18 and a sampling capacitance Cs 20. Considering only the tracking accuracy, with a conventional connection (i.e. Node B connected to $V_{SS}$), the differential equation governing the tracking operation is $$C_s \frac{dV_{out}}{dt} + \frac{dC_j V_{out}}{dt} = K\left[(V_{GO} - (1-\beta)V_s - V_T)V_{ds} - \frac{1}{2}V^2 ds^2\right],$$

where β determines the signal content in the gate voltage $V_G$, and $C_j$ 16, 18 are the junction capacitances of source and drain. Without solving the equation, it can be observed that current/voltage (I–V) curve is nonlinear, which results in a nonlinear channel resistance resistor. The problem with a conventional sampling switch then is that the switch on-resistance is input signal dependent, and generates harmonic distortion.

Programmable gain amplifiers such as illustrated in FIG. 8 that shows an inverting amplifier 200 and FIG. 9 that shows a differencing amplifier 300 are often also made with MOS switches in which MOS or CMOS transfer gates (switches) are used to select input and feedback resistors to achieve a desired gain. As discussed herein before, distortion occurs due to the modulation of the gate-to-source voltage of the active switches caused by the switch source/drain node voltage varying with the input or feedback signal. (It should be noted that in the case of MOS devices used for bi-directional transfer gates, either of the two source/drain terminals can be labeled as source or drain depending on the direction of instantaneous signal flow).

To reduce this distortion, the switches shown in FIGS. 8 and 9 are generally placed with one end attached to an opamp input which does not vary in voltage as much as other circuit nodes. This is especially true of the inverting amplifier configuration shown in FIG. 8 in which the negative input of opamp 202 acts as a virtual ground node. For the differencing amplifier configuration shown in FIG. 9, however, the voltages associated with both opamp 302 inputs vary significantly with the signal. Some improvement in switch linearity is obtained by scaling the switches so that their effective resistances are small compared to the resistors with which they are in series.

Another known method of reducing distortion is to generate signals that are level-shifted replicas of the input signal and use them to drive the gates of the NMOS and PMOS devices in an active switch so that their gate-to-source voltages are approximately constant for all values of the input signal. FIG. 2 illustrates a technique proposed by others in which the switch gate voltage $V_G$ is bootstrapped to be signal dependent (with β=1) and $V_{GS}$ is made constant. The signal dependent $V_{GS}$, that introduces a nonlinear switch on-resistance which is considered to be a first order effect, is then removed. This known technique is still problematic however, in that a residual non-linearity remains due to the modulation of the source to bulk (back gate) voltage.

In view of the foregoing, it is both advantageous and desirable to provide a technique to further improve the linearity of a MOS switch beyond that achievable using known methods and structures.

SUMMARY OF THE INVENTION

The present invention is directed to a technique to linearize a MOS switch's on-resistance and the nonlinear junction capacitance. The technique linearizes the MOS switch by using a unity gain buffer with proper DC shift to drive a MOS bulk (back gate) to improve the spurious free dynamic range (SFDR). In this way, the 2nd-order effect such as body effect ($V_T(V_{SB})$) and nonliner junction capacitance $C_j(V_{SB})$) can be substantially removed. The MOS front gate may or may not also be driven with a similar unity gain buffer having a different DC shift.

According to one embodiment, a method of linearizing a MOS-based switching circuit comprises the steps of providing a switching circuit having at least one MOS switch and a buffer having substantially unity gain and a DC voltage offset, wherein the at least one MOS switch comprises a source, a gate, a drain and a bulk terminal; and driving at least one MOS switch bulk terminal via the buffer in response to an input signal to provide a level-shifted replica of the input signal such that a desired DC voltage drop reverse biases at least one MOS switch source-bulk junction to control the spurious free dynamic range of the MOS-based switching circuit.

According to another embodiment, a method of linearizing a MOS-based switching circuit comprises the steps of providing a switching circuit having at least one MOS switch having a source, gate, drain and bulk terminal, and further having a level-shifting circuit; and driving the bulk terminal via the level-shifting circuit in response to an input signal to provide a level-shifted replica of the input signal such that a desired DC voltage drop reverse biases at least one MOS switch source-bulk junction to control the spurious free dynamic range of the switching circuit.

According to yet another embodiment, a method of linearizing a MOS-based switch comprises the steps of providing level-shifter and a MOS switch having a source, a gate, a drain and a bulk terminal; and driving the bulk terminal via the level-shifter in response to an input signal to provide a level-shifted replica of the input signal to control the spurious free dynamic range of the MOS switch.

According to still another embodiment, a MOS-based switching circuit comprises at least one MOS switch having a source, a gate, a drain and a bulk terminal; and control circuitry operational to selectively drive at least one MOS switch front gate and bulk in response to an input signal and reverse bias at least one MOS switch source-bulk junction to control at least one MOS switch source-bulk junction capacitance and linearity.

BRIEF DESCRIPTION OF THE DRAWINGS

Other aspects and features of the present invention and many of the attendant advantages of the present invention will be readily appreciated as the same become better understood by reference to the following detailed description when considered in connection with the accompanying drawings wherein.

While the above-identified drawing figures set forth particular embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION OF THE PREFERRED EMBODIMENTS

Figures 1, 2:
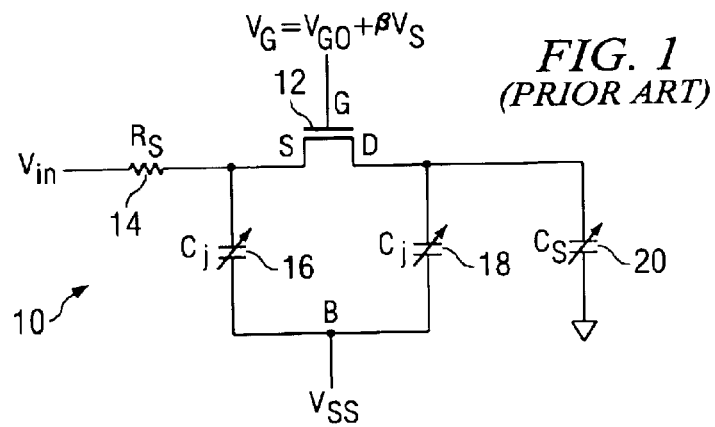
FIG. 1 illustrates a MOS switch with its front gate being driven with a signal in the form of the $V_G=V_{GO}+\beta V_S$ equation and its bulk being driven by a DC voltage, $V_{SS}$, and that is known in the art.
FIG. 2 is a schematic diagram illustrating a technique of increasing the linearity of a floating active resistor comprising matched and nonsaturated MOS transistors, and that is known in the art.
Figure 3:
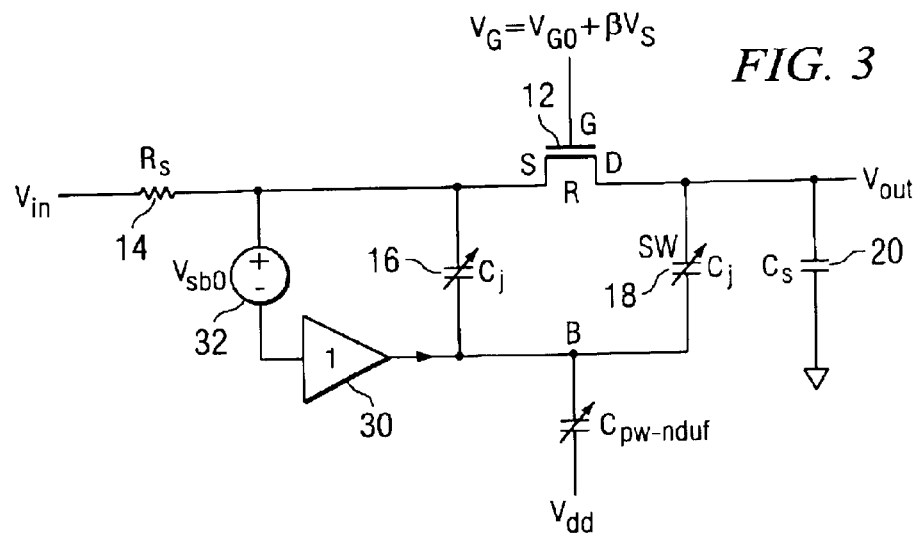
FIG. 3 illustrates a MOS switch with a lumped RC model and a unity gain buffer driving a MOS bulk terminal in order to remove the signal content from $V_{SB}$, and a DC voltage drop introduced to reverse bias the junction for limiting the junction capacitance size as well as its nonlinearity according to one embodiment of the present invention.

FIG. 3 illustrates a MOS switch 12 with a lumped RC model and a substantially unity gain buffer 30 driving a bulk terminal in order to remove the signal content from the source-to-bulk voltage $V_{SB}$, and a DC voltage shifter 32 introduced to reverse bias the junction for limiting the junction capacitance size as well as its nonlinearity according to one embodiment of the present invention. The present inventors observed that both $V_T$ associated with body effect and $C_j$ associated with junction capacitance, are $V_{SB}$ dependent. If the bulk terminal is driven with a buffer to track the input signal even with a reasonable amount of offset, $V_{SB}$ can be forced to be a constant. In this way both non-linear junction capacitance and nonlinear body effect are substantially removed. This technique is denoted herein after as the 'dynamically biased bulk terminal technique'. The buffer 30 is used to drive the MOS bulk terminal in order to remove the signal content from $V_{SB}$ as stated herein before; and a DC voltage offset 32 is introduced to reverse bias the junction for limiting the junction capacitance size as well as its nonlinearity.

The present inventors alone recognized that by driving both the gate and bulk with level-shifted replicas of the input signal as described herein before, all non-ideal sources can be substantially removed. The only residual error is from a non-zero voltage drop $V_{DS}$ across the MOS switch 12, which is very small. The spurious free dynamic range of the circuit 10 can therefore be increased significantly. There is however, a certain requirement on the buffer 30. The buffer 30 driving the bulk terminal might generate harmonic distortion that is capacitively coupled to the output through $C_j$ 18 and degrade the performance. There is thus a certain limit associated with the harmonic distortion level generated by the buffer.

Figure 4:
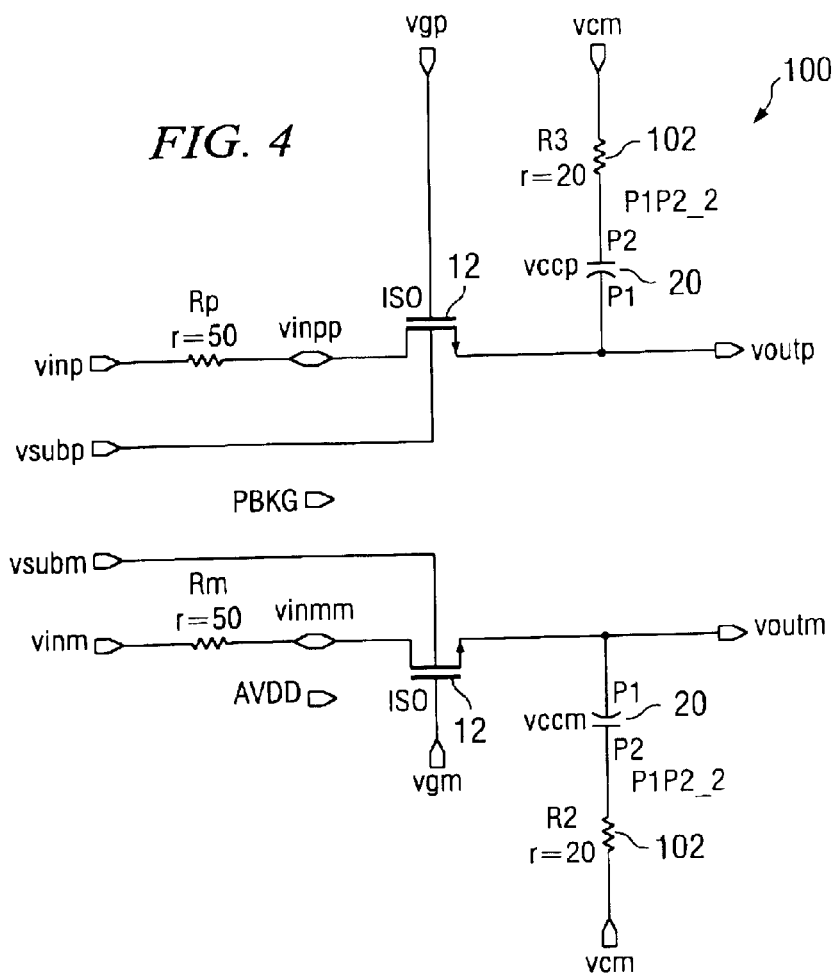
FIG. 4 is a schematic diagram illustrating a test circuit simulated in SPICE to implement a MOS switch, input resistors and a sampling capacitor.

FIG. 4 is a schematic diagram illustrating a test circuit 100 simulated in SPICE to implement a MOS switch, input resistors and a sampling capacitor. The present inventors recognized a highly linear sampling network generally requires a large size sampling switch (NMOS) 12, for example, W/L=320 in a 0.6 µm CMOS process; and the sampling capacitor $C_S$ 20 can be as high as 5 pF. With a 3.3V power supply, the effective switch resistance $R_{SW}$ 102 was controlled to be around 20 Ohms. The test signal level was 1.6 V p—p at 2 MHz and the gate voltage was bootstrapped signal-dependently to have a constant $V_{GS}$ of 1.55V.

Figure 5:
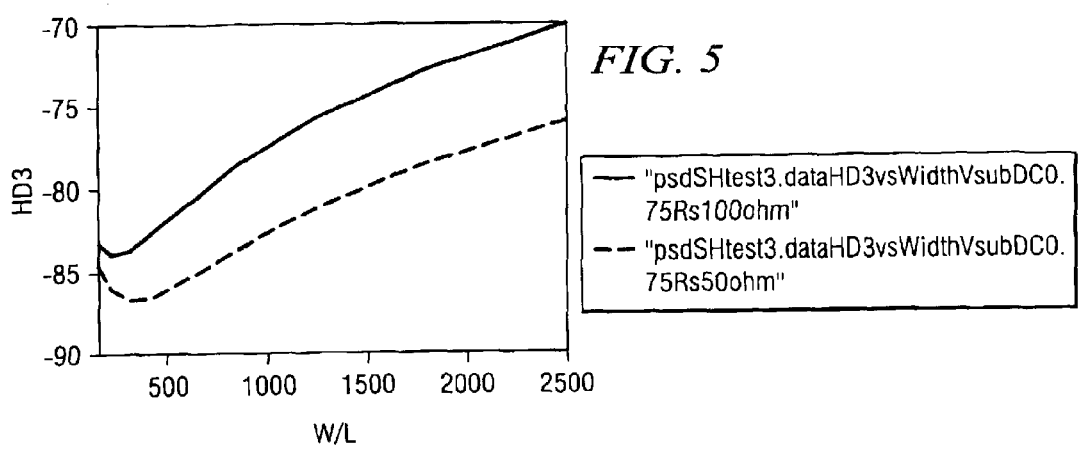
FIG. 5 is a graph illustrating third harmonic distortion (HD3) versus switch size for the test circuit shown in FIG. 6.

FIG. 5 is a graph illustrating HD3 vs. switch size for the test circuit 100 shown in FIG. 4. More specifically, this graph shows the HD3 versus the channel width of the MOS switch 12. It can be seen that HD3 is around −83.67 dB/−86.6 dB with a source resistance of 100 Ohms/50 Ohms at a VsubDC of −0.75V with a W/L of 320.

Figure 6:
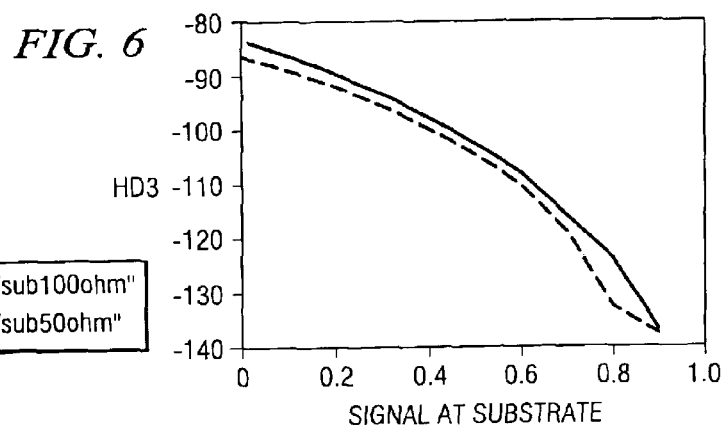
FIG. 6 is a graph illustrating HD3 versus signal content at the bulk terminal for the test circuit shown in FIG. 6.

FIG. 6 is a graph illustrating HD3 vs. signal content at the bulk terminal for the test circuit 100 shown in FIG. 4. More specifically, this graph shows the HD3 versus the signal-content in the voltage across the junction capacitors 16, 18. The junction is kept reverse biased with a $V_{DC}$ of −0.75V. When compared with the plot shown in FIG. 5, HD3 is significantly improved while the bulk terminal can track input more closely. Importantly, HD3 is still below −100 dB even with the presence of a gain error of −6 dB.

Figure 7:
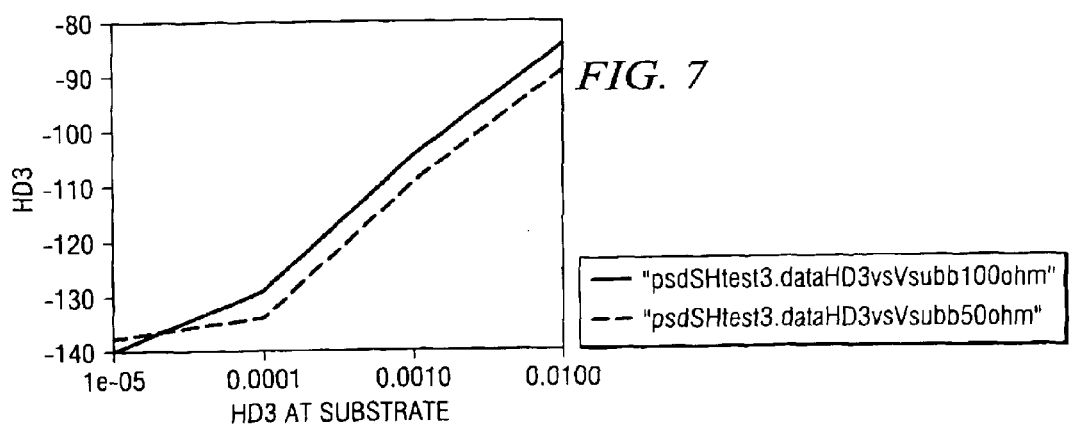
FIG. 7 is a graph illustrating HD3 at the output versus HD3 required at the bulk terminal for the test circuit shown in FIG. 6.
Figure 8:
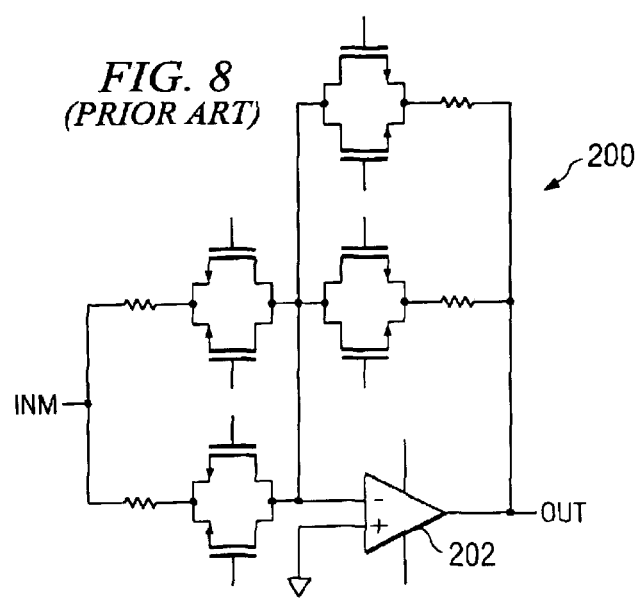
FIG. 8 illustrates a programmable gain inverting amplifier using MOS switches to select input and feedback resistors, and that is known in the art.
Figure 9:
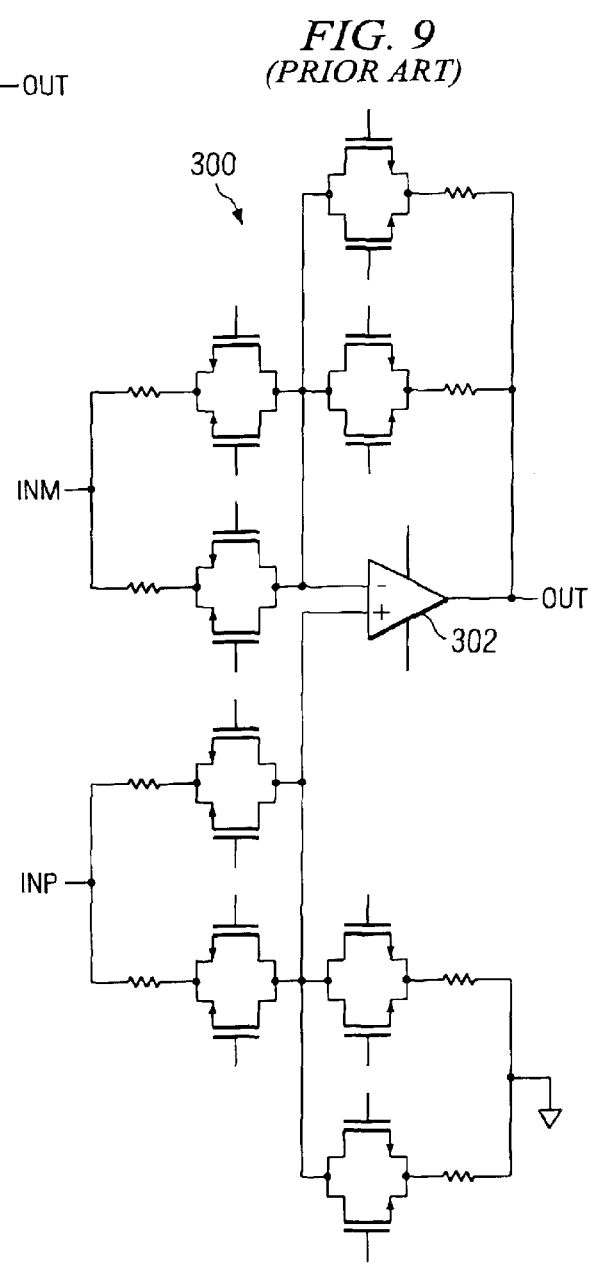
FIG. 9 illustrates a programmable gain differencing amplifier using MOS switches to select input and feedback resistors, and that is known in the art.

FIG. 7 is a graph illustrating HD3 at the output vs. HD3 required at the bulk terminal for the test circuit 100 shown in FIG. 4. Again with a VDC of −0.75V, it can be seen that HD3 at the output is below −100 dB even with the presence of a HD3 of −60 dB at the bulk terminal. The present inventors have therefore shown it is possible to design such a buffer.

Figure 10A:
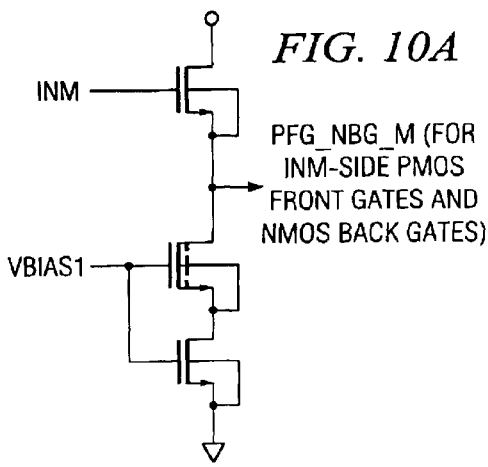
FIGS. 10A–10D illustrate circuits for driving NMOS and PMOS front gates and bulk terminals via level-shifted replicas of the input signal according to one embodiment of the present invention.
Figure 10B:
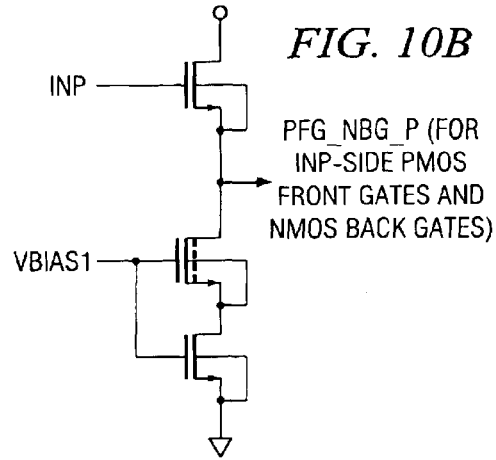
Figure 10C:
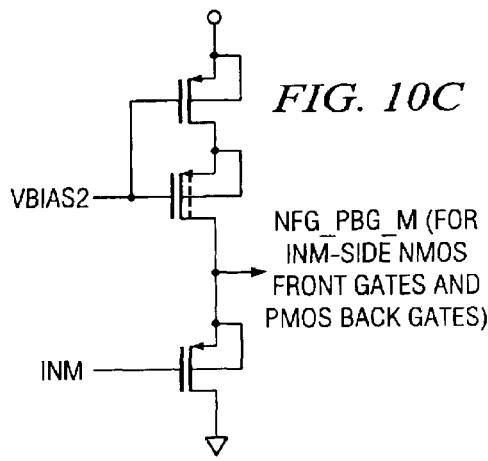
Figure 10D:
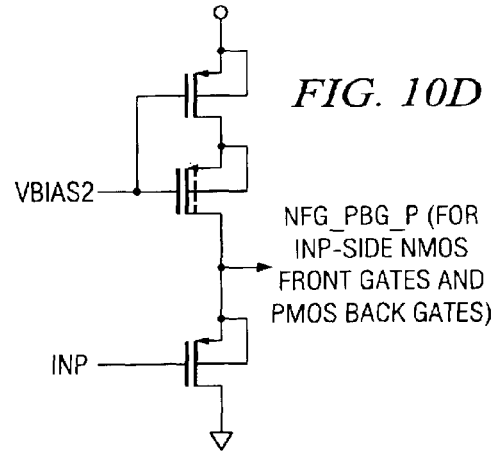

Looking now at FIGS. 10A–10D, circuit architectures are shown for generating the needed level-shifted replicas of the input signal in order to drive front gate and bulk terminals of NMOS and PMOS switches according to particular embodiments of the invention. The dotted lines in these figures indicate low-threshold transistors. Transistors with gates connected to VBIAS1 or VBIAS2 act as current sources for which other topologies can be substituted. More specifically, FIG. 10A relates to INM-side PMOS front gates and NMOS back gates; FIG. 10B relates to INP-side PMOS front gates and NMOS back gates; FIG. 10C relates to INM-side NMOS front gates and PMOS back gates; while FIG. 10D relates to INP-side NMOS front gates and PMOS back gates.

Figure 11:
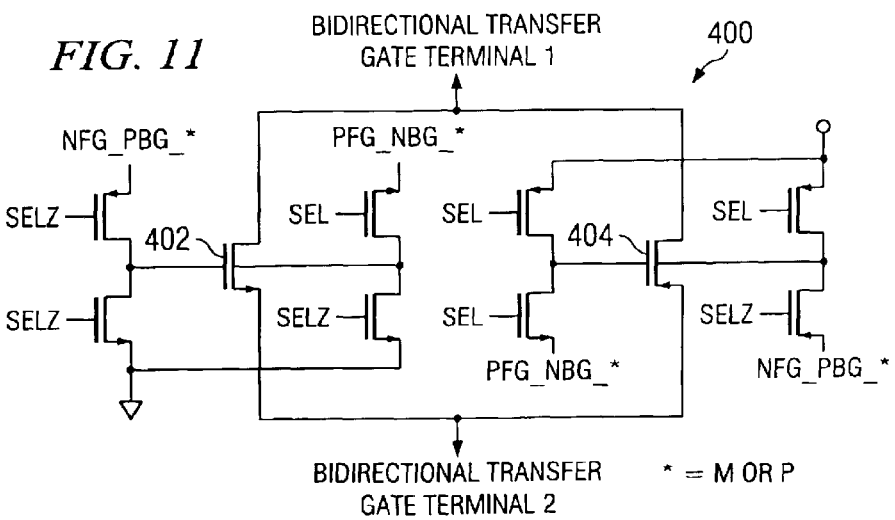
FIG. 11 illustrates a pair of bi-directional CMOS switches and control circuitry that turns them off or drives them with the appropriate level-shifted replicas of the input signals according to another embodiment of the present invention.

FIG. 11 illustrates a bi-directional transfer gate 400 including a pair of bi-directional CMOS switches 402, 404 and control circuitry that turns them off or drives them with the appropriate level-shifted replicas of the input signals according to another embodiment of the present invention. Back gate connections not shown are to appropriate power supplies. The transfer gate 400 is on when SEL is high and SELZ is low. The asterisk symbol * indicates either M or P.

In summary explanation of the above, a method has been described in association with various structures in which one or more MOS switches are implemented with bulk terminals biased to track the analog input and generate a constant source-to-bulk voltage $V_{SB}$. In other words, the MOS gate and bulk are driven with level-shifted replicas of the input signal. Both nonlinear junction capacitance $C_j$ and nonlinear body effect $V_T(V_{SB})$ are substantially removed. A Spice simulation was performed to verify the improvement.

In view of the above, it can be seen the present invention presents a significant advancement in the MOS switch art. Further, this invention has been described in considerable detail in order to provide those skilled in both the sampling and continuous time arts with the information needed to apply the novel principles and to construct and use such specialized components as are required.

It should be apparent that the present invention represents a significant departure from the prior art in construction and operation. However, while particular embodiments of the present invention have been described herein in detail, it is to be understood that various alterations, modifications and substitutions can be made therein without departing in any way from the spirit and scope of the present invention, as defined in the claims which follow.

What is claimed is:

1. A method of linearizing a MOS-based switching circuit, the method comprising the steps of:

providing a switching circuit having at least one MOS switch and a buffer having substantially unity gain and a DC voltage offset, wherein the at least one MOS switch comprises a source, a gate, a drain and a bulk terminal; and driving at least one MOS switch bulk terminal via the buffer in response to an input signal to provide a level-shifted replica of the input signal such that a desired DC voltage drop reverse biases at least one MOS switch source-bulk junction to control the spurious free dynamic range of the MOS-based switching circuit.

2. The method according to claim 1 wherein the step of driving at least one MOS switch bulk terminal via the buffer comprises driving the at least one MOS switch bulk terminal via the buffer in response to the input signal to substantially remove 2nd-order effects such as body effect ($V_T(V_{SB})$) and nonlinear junction capacitance ($C_j(V_{SB})$) associated with the MOS switch.

3. The method according to claim 1 wherein the step of driving the at least one MOS switch bulk terminal via the buffer comprises driving the at least one MOS switch bulk terminal to substantially remove any input signal content from the source-to-bulk voltage and reverse bias at least one MOS switch source-bulk junction to control nonlinear junction capacitance associated with the at least one MOS switch.

4. A method of linearizing a MOS-based switch, the method comprising the steps of:

providing level-shifter and a MOS switch having a source, a gate, a drain and a bulk terminal; and driving the bulk terminal via the level-shifter in response to an input signal to provide a level-shifted replica of the input signal to control the spurious dynamic range of the MOS switch, wherein the step of driving the bulk terminal via the level-shifter comprises driving the bulk terminal via a buffer having substantially unity gain and a DC voltage offset to reverse bias the source-bulk junction.

5. A method of linearizing a MOS-based switch, the method comprising the steps of:

providing level-shifter and a MOS switch having a source, a gate, a drain and a bulk terminal; and driving the bulk terminal via the level-shifter in response to an input signal to provide a level-shifted replica of the input signal to control the spurious dynamic range of the MOS switch, wherein the step of driving the bulk terminal via the level-shifter comprises driving the bulk terminal via a buffer having substantially unity gain and a DC voltage offset to substantially remove 2nd-order effect such as nonlinear body effect ($V_T(V_{SB})$) and nonlinear junction capacitance ($C_j(V_{SB})$) associated with the MOS switch.

6. A method of linearizing a MOS-based switch, the method comprising the steps of:

providing level-shifter and a MOS switch having a source, a gate, a drain and a bulk terminal; and driving the bulk terminal via the level-shifter in response to an input signal to provide a level-shifted replica of the input signal to control the spurious dynamic range of the MOS switch, wherein the step of driving the bulk terminal via the level-shifter comprises driving the bulk terminal via a buffer having substantially unit gain and a DC voltage offset to substantially remove any input signal content from the source-to-bulk voltage and reverse bias the source-bulk junction to control non-linear junction capacitance associated with the MOS switch.

7. A MOS-based switching circuit comprising:

at least one MOS switch having a source, a gate, a drain and a bulk terminal; and control circuitry operational to selectively drive at least one MOS switch front gate and bulk in response to an input signal and reverse bias at least one MOS switch source-bulk junction to control at least one MOS switch source-bulk junction capacitance and linearity, wherein the MOS-based switching circuit comprises a sampling network including at least one sampling capacitor.

8. A MOS-based switching circuit comprising:

at least one MOS switch having a source, a gate, a drain and a bulk terminal; and control circuitry operational to selectively drive at least one MOS switch front gate and bulk in response to an input signal and reverse bias at least one MOS switch source-bulk junction to control at least one MOS switch source-bulk junction capacitance and linearity, wherein the MOS-based switching circuit comprises a programmable gain amplifier (PGA) having at least one MOS switch configured to select desired input and feedback resistors to control the gain of the PGA.

9. The MOS-based switching circuit according to claim 8 wherein the PGA is an inverting amplifier.

10. The MOS-based switching circuit according to claim 8 wherein the PGA is a differencing amplifier.

11. A MOS-based switching circuit comprising:

at least one MOS switch having a source, a gate, a drain and a bulk terminal; and control circuitry operational to selectively drive at least one MOS switch front gate and bulk in response to an input signal and reverse bias at least one MOS switch source-bulk function to control at least one MOS switch source-bulk function capacitance and linearity, wherein the control circuitry comprises a buffer having substantially unity gain and a DC voltage offset.

* * * * *